United States Patent
Zhang (10) Patent No.: US 8,069,431 B1
(45) Date of Patent: Nov. 29, 2011

(54) ROUTING SIGNALS TO PINS OF COMPONENTS IN PROGRAMMABLE LOGIC DEVICES

(75) Inventor: Qinhai Zhang, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 385 days.

(21) Appl. No.: 12/406,772

(22) Filed: Mar. 18, 2009

(51) Int. Cl.
*G06F 17/50* (2006.01)

(52) U.S. Cl. ...................................... 716/128

(58) Field of Classification Search ............... 716/128
See application file for complete search history.

(56) References Cited

U.S. PATENT DOCUMENTS

| | | | |
|---|---|---|---|
| 6,631,510 B1 | 10/2003 | Betz et al. | |
| 6,877,040 B1 | 4/2005 | Nam et al. | |
| 7,111,268 B1 | 9/2006 | Anderson et al. | |
| 7,134,112 B1 | 11/2006 | Anderson et al. | |
| 7,376,926 B1* | 5/2008 | Kong et al. | 716/130 |
| 7,424,697 B1 | 9/2008 | Arslan et al. | |
| 7,735,047 B1* | 6/2010 | Anderson et al. | 716/116 |
| 7,814,452 B1* | 10/2010 | Jang et al. | 716/100 |
| 2005/0156626 A1* | 7/2005 | Tomar et al. | 326/38 |
| 2007/0300193 A1* | 12/2007 | Lillis et al. | 716/3 |
| 2009/0249276 A1* | 10/2009 | Wu et al. | 716/16 |
| 2009/0300571 A1* | 12/2009 | Wu et al. | 716/16 |

OTHER PUBLICATIONS

Naveed A. Sherwani, Algorithms for VLSI Physical Design Automation, Third Edition, 1999, pp. 261-263.
Ebeling et al., Placement and Routing Tools for the Triptych FPGA, IEEE Transactions on VLSI Systems, vol. 3, No. 4, Dec. 1995, pp. 473-482.
McMurchie et al., PathFinder: A Negotiation-Based Peformance-Driven Router for FPGAs, Proceedings of Third International ACM/SIGDA Symposium on Field Programmable Gate Arrays, Feb. 1995, pp. 111-117.
Optimized FPGA Architecture for Low Cost Applications, http://www.latticesemi.com/products/fpga/ecp2/optimizedfpgaarchitecture.cfm, printed Nov. 25, 2008, 2 pages.
Brown et al., A Detailed Router for Field-Programmable Gate Arrays, IEEE Transactions on Computer-Aided Design, vol. 11, No. 5, May 1992, pp. 620-628.
Maze Router: Lee Algorithm, http://www.ece.northwestern.edu/~haizhou/357/lec6.pdf, pp. 1-18, Before Mar. 18, 2009.

* cited by examiner

*Primary Examiner* — Suresh Memula
(74) *Attorney, Agent, or Firm* — Haynes and Boone, LLP (57) ABSTRACT

Various techniques are provided for routing signals to pins of components of programmable logic devices (PLDs). In one example, a computer-implemented method of routing signals in a PLD includes routing a plurality of signals to pins of a component of the PLD. At least two of the signals are routed to a same pin. The method also includes, for each of the signals routed to the same pin, determining a cost value associated with each of two or more pins. the method also includes, for each of the signals routed to the same pin, rerouting the signal to one of the two or more pins having the lowest cost value. The method also includes repeating the determining a cost value and the rerouting until no more than one signal is routed to a pin.

20 Claims, 5 Drawing Sheets

ROUTING SIGNALS TO PINS OF COMPONENTS IN PROGRAMMABLE LOGIC DEVICES

TECHNICAL FIELD

The present invention relates generally to programmable logic devices and, more particularly for example, to the routing of signals to components in programmable logic devices.

BACKGROUND

Programmable logic devices (PLDs), such as field programmable gate arrays (FPGAs) or complex programmable logic devices (CPLDs), may be configured to provide user-defined features. PLDs typically include various components, such as programmable logic cells, memory cells, digital signal processing cells, input/output cells, and other components. The PLD components may be interconnected through signal paths provided by routing resources of the PLD to implement a desired circuit design.

However, PLDs typically have a limited supply of routing resources available to provide signal paths through the PLD to a target component of the PLD. This differs from conventional application-specific integrated circuits (ASICs) in which typically any desired signal path may be custom-manufactured for a particular application.

Unfortunately, existing approaches to PLD signal path routing often fail to provide efficient signal paths. For example, a conventional maze routing approach will typically consider signals one at a time. After a signal has been assigned to a routing resource, the routing resource will not be considered as a possible routing resource for other signals. As a result, the order in which signals are selected and routing resources are assigned may significantly impact the availability of various routing resources and thus prevent routing resources from being used efficiently to provide signal paths that meet the timing requirements of a particular design. If signals are unable to be routed or if timing violations occur, then "ripup" and "reroute" techniques may be used to remove routed signal paths and attempt to reroute them through routing resources of the PLD. Such techniques are inefficient and can significantly increase the time and processing needed to determine signal routings for the PLD.

In another example, a negotiation-based routing approach may be used to route multiple signals using the same routing resource and then resolve conflicts between commonly-routed signals based on priorities associated with the signals. Although this negotiation-based routing approach may provide improved performance over the above-described maze routing approach, this approach nevertheless does not provide sufficient flexibility in the rerouting of signals to different destinations. In particular, such an approach does not permit signals to be commonly-routed to the same pin of a reconfigurable component of the PLD. This limitation can inhibit the overall effectiveness of such an approach. Accordingly, there is a need for an improved approach to the routing of signals in PLDs.

SUMMARY

In accordance with one embodiment of the present invention, a computer-implemented method of routing signals in a programmable logic device (PLD) includes routing a plurality of signals to pins of a component of the PLD, wherein at least two of the signals are routed to a same pin; for each of the signals routed to the same pin, determining a cost value associated with each of two or more pins; for each of the signals routed to the same pin, rerouting the signal to one of the two or more pins having the lowest cost value; and repeating the determining a cost value and the rerouting until no more than one signal is routed to a pin.

In accordance with another embodiment of the present invention, a system includes one or more processors; and one or more memories adapted to store a plurality of computer readable instructions which when executed by the one or more processors are adapted to cause the system to perform a computer-implemented method of routing signals in a programmable logic device (PLD), the method includes routing a plurality of signals to pins of a component of the PLD, wherein at least two of the signals are routed to a same pin, for each of the signals routed to the same pin, determining a cost value associated with each of two or more pins, for each of the signals routed to the same pin, rerouting the signal to one of the two or more pins having the lowest cost value, and repeating the determining a cost value and the rerouting until no more than one signal is routed to a pin.

In accordance with another embodiment of the present invention, a system for routing signals in a programmable logic device (PLD) includes means for routing a plurality of signals to pins of a component of the PLD, wherein at least two of the signals are routed to a same pin; means for determining, for each of the signals routed to the same pin, a cost value associated with each of two or more pins; means for rerouting each of the signals routed to the same pin to one of the two or more pins having the lowest cost value; and means for repeating the determining a cost value and the rerouting until no more than one signal is routed to a pin.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, signals may be routed to a PLD component having a plurality of input terminals (hereafter referred to as "pins") which may receive the signals from other routing resources of the PLD. Pins of the component may be considered to be "logic equivalent" pins if the pins may be swapped (e.g., signals routed to the pins may be exchanged for each other) without changing the functionality of the component. For example, logic operations performed by a lookup table (LUT) component of a PLD are dependant on the particular configuration of the LUT. Because the LUT may be selectively re-configured to provide a desired logic function when input signals are exchanged, the corresponding input pins of the LUT may be considered to be logic equivalent pins.

In accordance with techniques further described herein, multiple signals may be selectively routed to logic equivalent pins of a PLD component. An iterative process may be performed in which cost values associated with the pins are determined. Such cost values may be based on, for example, signal path delays (e.g., logic delays and wiring delays), signal timing criteria, congestion values associated with the routing of multiple signals to the same pin, and/or other criteria. The signals may be rerouted to other logic equivalent pins based on the determined cost values. After the signals are all routed to unique logic equivalent pins (e.g., multiple signals are no longer routed to the same pins), the component may be configured based on the new signal routings.

Figure 1:
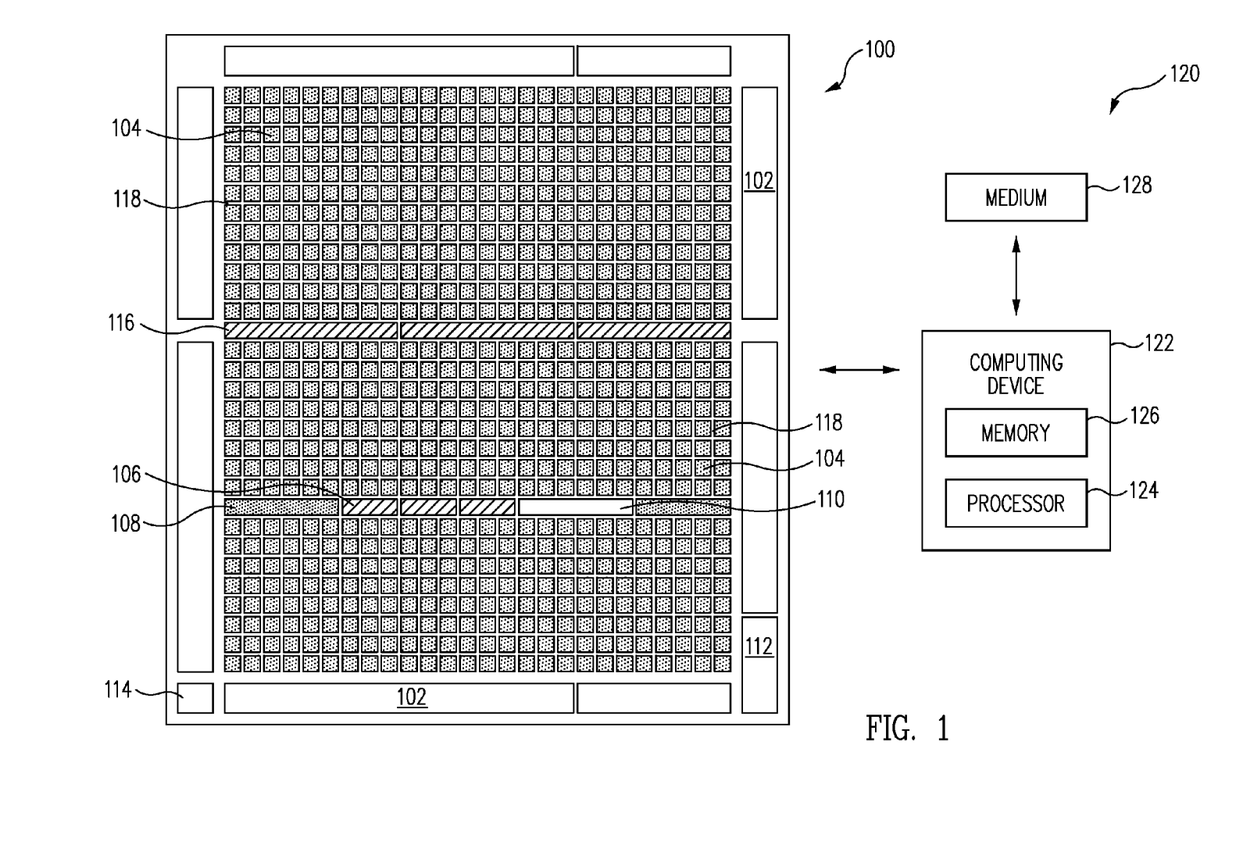
FIG. 1 illustrates a block diagram of a programmable logic device (PLD) and a system for generating configuration data for use with the PLD in accordance with an embodiment of the invention.

FIG. 1 illustrates a block diagram of a programmable logic device (PLD) 100 and a system 120 for generating configuration data for use with PLD 100 in accordance with an embodiment of the invention. In one embodiment, PLD 100 may be implemented as a PLD in the ECP2/M family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein. In one embodiment, such software may be implemented as ispLEVER 7.1 software available from Lattice Semiconductor Corporation of Hillsboro, Oreg.

In one embodiment, means such as processor 124 configured with such software may be used for routing a plurality of signals to pins of a component of the PLD, wherein at least two of the signals are routed to a same pin, determining, for each of the signals routed to the same pin, a cost value associated with each of two or more pins, rerouting each of the signals routed to the same pin to one of the two or more pins having the lowest cost value, and repeating the determining a cost value and the rerouting until no more than one signal is routed to a pin.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

Figure 2:
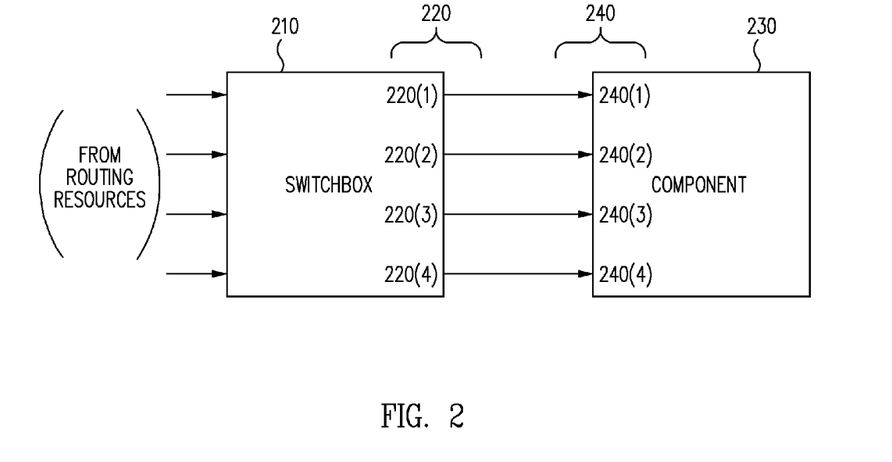
FIG. 2 illustrates a component and a switchbox of a PLD in accordance with an embodiment of the invention.

FIG. 2 illustrates an example of a component 230 and a switchbox 210 of PLD 100 in accordance with an embodiment of the invention. Component 230 includes a plurality of pins 240 (labeled 240(1) to 240(4)) connected to switchbox 210. Component 230 may be used as a sub-block in programmable logic blocks 104 or other components of PLD 100 identified herein. For example, in one embodiment, component 230 may be a LUT or other programmable component that is selectively configured to perform various logic operations based on signals received at pins 240.

Switchbox 210 may be implemented, for example, as part of routing resources 118 of PLD 100. Switchbox 210 receives signals from other locations of PLD 100 through other portions of routing resources 118 and provides the signals to a plurality of wiring nodes 220 (labeled 220(1) to 220(4)).

In the particular embodiment illustrated in FIG. 2, there is a one-to-one correspondence between wiring nodes 220(1) to 220(4) and pins 240(1) to 240(4). That is, signals routed to wiring nodes 220(1) to 220(4) will be passed directly to pins 240(1) to 240(4), respectively, of component 230. Accordingly, it will be appreciated that in this embodiment, the routing of a signal to a particular wiring node 220 will also effectively route the signal to a corresponding pin 240. However, it is contemplated that different routings may be provided between wiring nodes 220 and pins 240 in other embodiments.

In this embodiment, it is assumed that all of pins 240 are logic equivalent pins. Accordingly, each of pins 240 may be swapped with each other such that signals provided to particular pins 240 may be instead provided to different pins 240. For example, component 230 may be configured to perform a desired function in response to particular signals routed to particular pins 240. If these signal-to-pin routings are changed by swapping particular pins 240 (e.g., by swapping the signals routed to particular pins 240), then component 230 may be reconfigured to perform the desired function based on the new signal routings.

Figure 3:
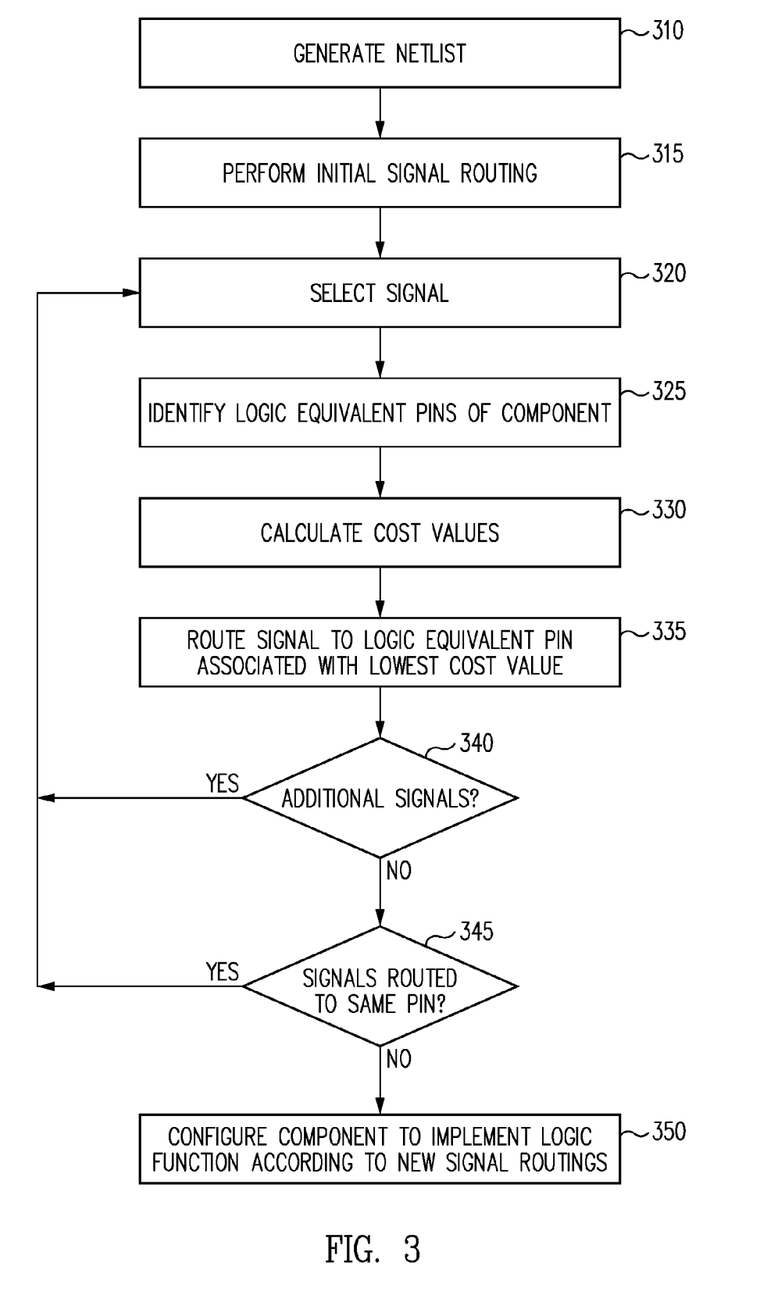
FIG. 3 illustrates a process of routing signals in accordance with an embodiment of the invention

FIG. 3 illustrates a process of routing signals to pins 240 of component 230 in accordance with an embodiment of the invention. In one embodiment, the process of FIG. 3 may be performed by system 120 of FIG. 1.

In block 310, system 120 generates a netlist to identify the source and destination locations of signals to be routed for a desired configuration of PLD 100. For example, the netlist may identify one or more signals to be routed to component 230.

Figure 4:
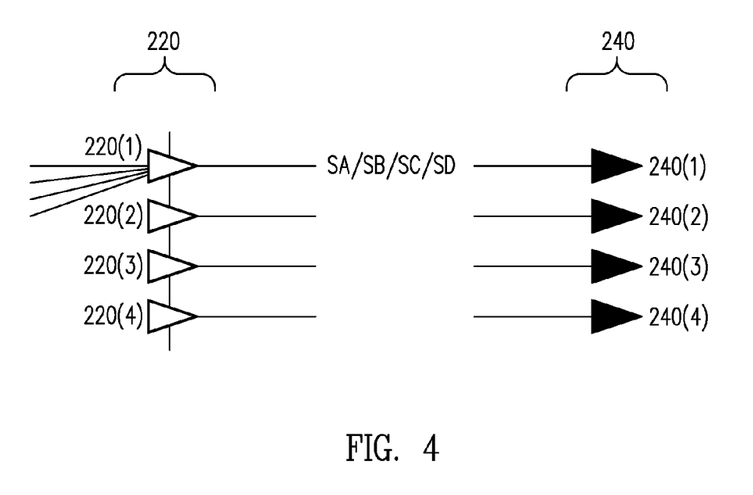
FIGS. 4-6 illustrate signal routings during the process of FIG. 3 in accordance with embodiments of the invention.

In block 315, system 120 performs an initial routing of at least some of the signals identified in the netlist. For example, FIG. 4 illustrates a conceptual view of wiring nodes 220(1) to 220(4) and pins 240(1) to 240(4) after block 315 has been performed. As shown in FIG. 4, signals SA, SB, SC, and SD have been routed to pin 240(1) which is associated with wiring node 220(1).

In blocks 320 to 345, system 120 performs an iterative process in which signals SA to SD are selectively rerouted to different pins 240 in order to improve the performance of PLD 100.

In block 320, system 120 identifies any signals that are routed to the same pin 240 and selects a first one of the signals. In this example, all of signals SA to SD are routed to the same pin 240(1). Accordingly, system 120 selects one of these signals in block 320. The particular signal selected in block 320 may be identified using any desired ranking approach as may be appropriate for particular applications. For example, signals SA to SD may be ranked based on signal timing (e.g., timing slack associated with each signal) or other criteria identified by system 120. In this embodiment, it is assumed that signal SA is the first signal selected in block 320.

In another embodiment, system 120 may select in block 320 any signal that has not yet been routed (e.g., any signal that was not routed during the initial routing of block 315). As a result, any signals of the netlist that were not initially routed may be considered for routing to pins 240 of component 230 during the process of FIG. 3.

In block 325, system 120 identifies any logic equivalent pins of component 230 to which the selected signal SA may be connected. Particular pins 240 of component 230 may be considered to be logic equivalents of each other if component 230 may be reconfigured to perform the same operation on a given signal connected to the pins 240. Accordingly, in an embodiment where component 230 is a LUT which may be reprogrammed to support a desired logic function for any of pins 240, then all of pins 240 will be considered to be logic equivalent pins of each other. Therefore, in the embodiment shown in FIG. 4, all of pins 240 will be identified in block 325 as logic equivalent pins to which signal SA may be routed.

In block 330, system 120 calculates a cost value associated with each of the logic equivalent pins 240 that were identified in previous block 325. For example, if all of, pins 240 were identified in previous block 325, then a cost value may be calculated in block 330 for each one of pins 240.

The cost values calculated in block 330 may be based on various factors such as, for example, the timing of the selected signal, the number of signals routed to the pin 240, timing delays associated with the path of the signal through routing resources 118 of PLD 100 to the pin 240, timing delays associated with component 230 when receiving signals from the pin 240, and/or other factors.

For example, if multiple signals are routed to a given pin 240, then that pin 240 may have an associated high cost value. As a result, system 120 may attempt to reroute signals that are currently routed to that pin 240 to other pins 240 with lower associated cost values. As another example, for signals that have critical timing requirements, any pins 240 that would introduce significant signal delays may have associated high cost values. As a result, such critical signals may be routed to other pins 240 with lower associated cost values (e.g., pins 240 that would not introduce significant signal delays).

By combining the above examples together and scaling the various cost factors in relation to each other, system 120 can route critical signals to pins 240 using the shortest possible distance to avoid incurring costs associated with signal path delays or logic delays (e.g., delays caused by logic components), even if such pins 240 are currently shared by other signals. Meanwhile, system 120 may route less critical signals away from shared pins 240 (e.g., having an associated high cost value) to other pins 240 which are not shared.

In one embodiment, a cost value associated with each pin 240 calculated in block 330 may be determined in accordance with conventional techniques such as those set forth in the publication: McMurchie et al, "Pathfinder: A Negotiation-Based Performance-Driven Router for FPGAs," Proceedings of 3rd International ACM/SIGDA Symposium on Field Programmable Gate Arrays, February 1995, pp 111-117.

In block 335, system 120 routes (e.g., reroutes) signal SA to the one of pins 240 having the lowest associated cost value calculated in previous block 330. This rerouting may be to any of pins 240, including pin 240(1) to which signal SA was initially routed to in block 315.

In block 340, if additional signals remain to be selected (e.g., signals SB, SC, and SD in this embodiment), then blocks 320 to 335 are repeated for each of the remaining signals to route the remaining signals to use either the same pins (e.g., the same pins as previously routed in block 315) or different pins 240.

Figure 5:
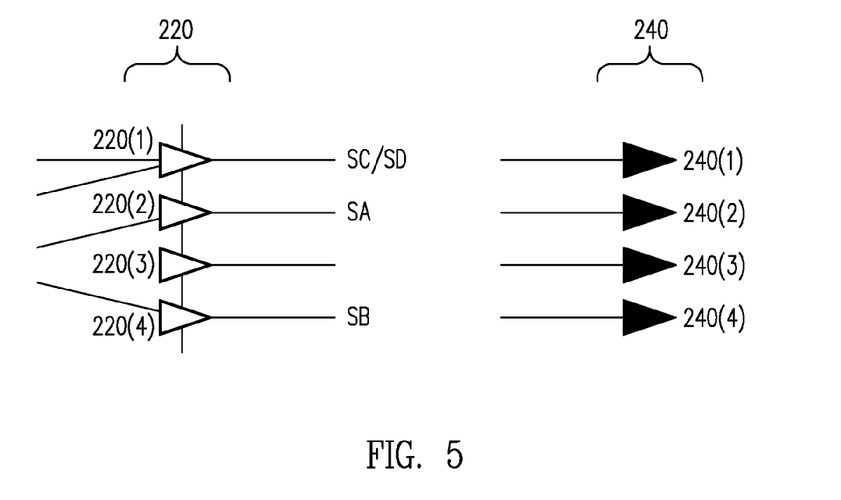

After all signals have been considered during blocks 320 to 335, each of one of the signals SA to SD will have been routed to one of pins 240 based on cost values calculated in block 330. For example, FIG. 5 illustrates a conceptual view of wiring nodes 220(1) to 220(4) and pins 240(1) to 240(4) after blocks 320 to 335 have been completed for each of signals SA to SD. As shown in FIG. 5, signals SA and SB have been rerouted to pins 240(2) and 220(4), respectively. Meanwhile, signals SC and SD remain routed to pin 240(1). In this regard, it will be appreciated that pin 240(1) continues to have the lowest associated cost value for each of signals SC and SD. These different signal routings shown in FIG. 5 may be attributable to, for example, differences in the timing critical ratios associated with signals SC and SD in comparison to signals SA and SB, or other factors previously discussed.

The process of FIG. 3 continues to block 345 in which system 120 determines whether any of signals SA to SD are routed to a common (i.e., shared) pin 240. As identified in FIG. 5, signals SC and SD are indeed routed to the same pin 240(1). As a result, the process of FIG. 3 repeats blocks 320 to 335 for signals SC and SD.

In the repeated iterations of block 330, the cost values calculated for signals SC and SD with respect to each pin 240 may change based on the demand for a shared pin 240. For example, the cost value for a given pin 240 may increase as additional signals are routed to the pin 240 or may decrease as signals are routed to other pins 240 instead. These changes in the cost value can affect the rerouting performed in subsequent block 335.

Figure 6:
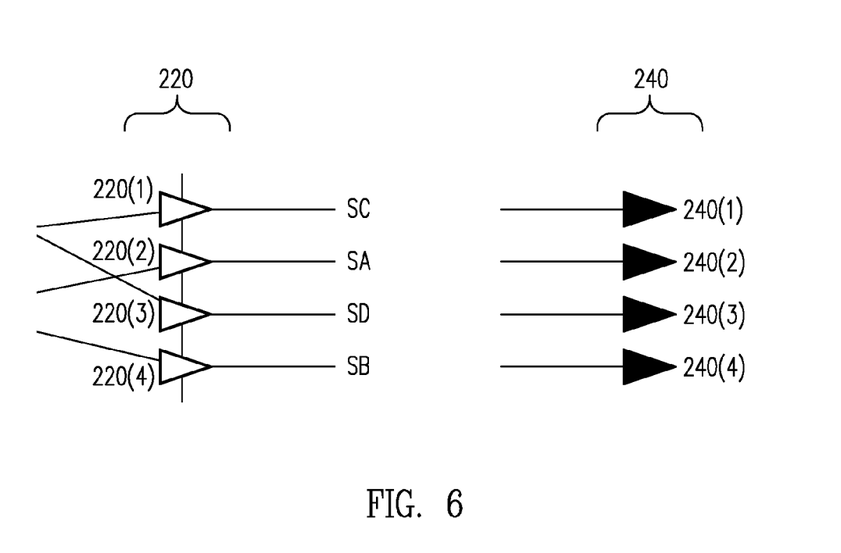

FIG. 6 illustrates a conceptual view of wiring nodes 220(1) to 220(4) and pins 240(1) to 240(4) after blocks 320 to 335 have been completed again for each of signals SC and SD. As shown in FIG. 6, signal SD has been rerouted to pin 240(3) based on further cost value calculations determined during the process of FIG. 3. System 120 therefore determines in block 345 that none of signals SA to SD are routed to the same pin 240. As a result, the process continues to block 350.

As previously discussed, because component 230 may be selectively reconfigured to support various signal-to-pin routings, pins 240 are logic equivalent pins which may be selectively swapped with each other as desired in particular applications. As such, component 230 may be flexibly configured as desired to support the final signal routings shown in FIG. 6.

Accordingly, in block 350, system 120 determines a configuration of component 230 to implement one or more logic functions in response to signals SA to SD as part of the overall configuration of PLD 100. For example, in one embodiment, component 230 is a LUT which may be selectively configured to perform one or more logic functions in response to signals received at pins 240. Accordingly, in block 350, system 120 prepares an appropriate data structure to configure component 230 to provide output values corresponding to a desired function in response to various combinations of input signal values received at pins 240 in accordance with the final signal routings shown in FIG. 6.

Testing performed using the process of FIG. 3 has shown that the process provides improved performance in comparison with other approaches to signal routing in PLDs. For example, the following tables provide test results measuring a performance achievement percentage (PAP) value for various configurations of PLD 100 in comparison with other signal routing approaches. The PAP values may be determined in accordance with the following equation 1:

PAP=minimum(achieved clock frequency/specified clock frequency, for all clocks of PLD)*100%  (equation 1)

The following tables also identify processing time (CPU time) of system 120 to perform the routing of signals for each configuration.

Specifically, the following Table 1 compares the process of FIG. 3 with a conventional ripup-based approach to signal routings:

TABLE 1

| Design | Ripup-based approach | | Process of FIG. 3 | | Improvements | |
|---|---|---|---|---|---|---|
| | PAP | CPU (m) | PAP | CPU (m) | PAP (%) | CPU (%) |
| bbu | 79.9 | 38.98 | 80.3 | 41.92 | 0.50% | 7.52% |
| clif | 69 | 16.98 | 66.07 | 18.25 | −4.25% | 7.46% |
| cr32 | 61.22 | 27.62 | 62.88 | 19.18 | 2.71% | −30.54% |
| elan | 100.53 | 6.80 | 103.62 | 13.15 | 3.07% | 93.38% |
| fsa | 95.56 | 27.02 | 99.05 | 58.90 | 3.65% | 118.01% |
| mdu | 87.09 | 23.37 | 86.48 | 21.57 | −0.70% | −7.70% |
| mpb | 57.59 | 97.17 | 72.8 | 38.80 | 26.41% | −60.07% |
| noza | 85.87 | 30.70 | 86.5 | 34.65 | 0.73% | 12.87% |
| rijn | 41.44 | 13.67 | 43.3 | 23.13 | 4.49% | 69.27% |
| s330 | 85.03 | 40.37 | 89.72 | 41.90 | 5.52% | 3.80% |
| sp7 | 65.19 | 38.58 | 65.31 | 29.30 | 0.18% | −24.06% |
| Average | | | | | 3.85% | 17.27% |

The following Table 2 compares the process of FIG. 3 with a negotiation-based routing approach which does not permit signals to be commonly-routed to the same pin of a reconfigurable component of the PLD:

TABLE 2

| Design | Negotiation-based approach without commonly-routed pins | | Process of FIG. 3 | | Improvements | |
|---|---|---|---|---|---|---|
| | PAP | CPU (m) | PAP | CPU (m) | PAP (%) | CPU (%) |
| bbu | 73.2 | 84.73 | 80.3 | 41.92 | 9.70% | −50.53% |
| clif | 63.11 | 39.08 | 66.07 | 18.25 | 4.69% | −53.30% |
| cr32 | 55.57 | 32.00 | 62.88 | 19.18 | 13.15% | −40.05% |
| elan | 97.33 | 16.75 | 103.62 | 13.15 | 6.46% | −21.49% |
| fsa | 94.17 | 87.30 | 99.05 | 58.90 | 5.18% | −32.53% |
| mdu | 79.18 | 22.22 | 86.48 | 21.57 | 9.22% | −2.93% |
| mpb | 61.68 | 120.47 | 72.8 | 38.80 | 18.03% | −67.79% |
| noza | 80.35 | 46.22 | 86.5 | 34.65 | 7.65% | −25.03% |
| rijn | 39.83 | 15.33 | 43.3 | 23.13 | 8.71% | 50.87% |
| s330 | 80.76 | 40.83 | 89.72 | 41.90 | 11.09% | 2.61% |
| sp7 | 53.58 | 35.97 | 65.31 | 29.30 | 21.89% | −18.54% |
| Average | | | | | 10.53% | −23.52% |

As shown in Tables 1 and 2, the process of FIG. 3 provides significant performance improvements for many configurations of PLD 100.

Embodiments described above illustrate but do not limit the invention. It should also be understood that numerous modifications and variations are possible in accordance with the principles of the present invention. Accordingly, the scope of the invention is defined only by the following claims.

I claim:

1. A computer-implemented method of routing signals in a programmable logic device (PLD), the method comprising:
   routing a plurality of signals to pins of a PLD component configured to perform a logic function, wherein at least two of the plurality of signals are routed to a same component pin;
   for each of the signals routed to the same pin:
      identifying one or more other component pins that are a logic equivalents to the same pin;
      calculating a cost value associated with each of the logic equivalent pins, which include the same pin and the one or more other logic equivalent pins; and
      routing the signal to the logic equivalent pin having the lowest cost value; and reconfiguring the component to perform the logic function in accordance with any change in signal routings to logic equivalent pins.

2. The method of claim 1, wherein routing the signal to the logic equivalent pin having the lowest cost value includes leaving the signal at the same pin if the same pin has the lowest cost value.

3. The method of claim 1, wherein the cost value associated with a same pin changes as the number of signals routed to the same pin changes.

4. The method of claim 1 including repeating the identifying, calculating, and routing steps for any signals that are routed to a same pin as a result of an application the method.

5. The method of claim 1, wherein the cost values are calculated using timing criteria associated with the signals.

6. The method of claim 1, wherein the cost values are calculated using logic delays associated with the component.

7. The method of claim 1, wherein the cost values are calculated using congestion values associated with the signals routed to the same pin.

8. A system comprising:
one or more processors; and
one or more memories adapted to store a plurality of computer readable instructions which when executed by the one or more processors are adapted to cause the system to perform a computer-implemented method of routing signals in a programmable logic device (PLD), the method comprising:
routing a plurality of signals to pins of a PLD component configured to perform a logic function, wherein at least two of the plurality of signals are routed to a same component pin;
for each of the signals routed to the same pin:
identifying one or more other component pins that are a logic equivalents to the same pin;
calculating a cost value associated with each of the logic equivalent pins, which include the same pin and the one or more other logic equivalent pins; and
routing the signal to the logic equivalent pin having the lowest cost value; and
reconfiguring the component to perform the logic function in accordance with any change in signal routings to logic equivalent pins.

9. The system of claim 8, wherein routing the signal to the logic equivalent pin having the lowest cost value includes leaving the signal at the same pin if the same pin has the lowest cost value.

10. The system of claim 8, wherein the cost value associated with a same pin changes as the number of signals routed to the same pin changes.

11. The system of claim 8, wherein the method includes repeating the identifying, calculating, and routing steps for any signals that are routed to a same pin as a result of an application the method.

12. The system of claim 8, wherein the cost values are calculated using timing criteria associated with the signals.

13. The system of claim 8, wherein the cost values are calculated using logic delays associated with the component.

14. The method of claim 8, wherein the cost values are calculated using congestion values associated with the signals routed to the same pin.

15. A non-transitory computer readable medium in which are stored computer readable instruction for performing a method of routing signals in a programmable logic device (PLD), the method comprising:
routing a plurality of signals to pins of a PLD component configured to perform a logic function, wherein at least two of the plurality of signals are routed to a same component pin;
for each of the signals routed to the same pin:
identifying one or more other component pins that are a logic equivalents to the same pin;
calculating a cost value associated with each of the logic equivalent pins, which include the same pin and the one or more other logic equivalent pins; and
routing the signal to the logic equivalent pin having the lowest cost value; and
reconfiguring the component to perform the logic function in accordance with any change in signal routings to logic equivalent pins.

16. The computer readable medium of claim 15, wherein routing the signal to the logic equivalent pin having the lowest cost value includes leaving the signal at the same pin if the same pin has the lowest cost value.

17. The computer readable medium of claim 15, wherein the cost value associated with a same pin changes as the number of signals routed to the same pin changes.

18. The computer readable medium of claim 15, wherein the method includes repeating the identifying, calculating, and routing steps for any signals that are routed to a same pin as a result of an application the method.

19. The computer readable medium of claim 15, wherein the cost values are calculated using timing criteria associated with the signals.

20. The computer readable medium of claim 15, wherein the cost values are calculated using logic delays associated with the component.

* * * * *

UNITED STATES PATENT AND TRADEMARK OFFICE
CERTIFICATE OF CORRECTION

PATENT NO. : 8,069,431 B1  
APPLICATION NO. : 12/406772  
DATED : November 29, 2011  
INVENTOR(S) : Qinhai Zhang Page 1 of 1

It is certified that error appears in the above-identified patent and that said Letters Patent is hereby corrected as shown below:

In the Claims

Col. 9, line 13: Change "application the method." to --application of the method.--.
Col. 10, line 1: Change "wherein the method includes" to --wherein the system includes--.
Col. 10, line 4: Change "application the method." to --application of the method.--.
Col. 10, line 4: Change "application the method." to --application of the method.--.

Signed and Sealed this
Twenty-fourth Day of September, 2013

Teresa Stanek Rea
*Deputy Director of the United States Patent and Trademark Office*